US008211238B2

(12) United States Patent
Bailey, III et al.

(10) Patent No.: US 8,211,238 B2
(45) Date of Patent: Jul. 3, 2012

(54) SYSTEM, METHOD AND APPARATUS FOR SELF-CLEANING DRY ETCH

(75) Inventors: Andrew D. Bailey, III, Pleasanton, CA (US); Shrikant P. Lohokare, Fremont, CA (US); Arthur M. Howald, Pleasanton, CA (US); Yunsang Kim, San Jose, CA (US)

(73) Assignee: Lam Research Corporation, Fremont, CA (US)

( * ) Notice: Subject to any disclaimer, the term of this patent is extended or adjusted under 35 U.S.C. 154(b) by 487 days.

(21) Appl. No.: 11/444,942

(22) Filed: May 31, 2006

(65) Prior Publication Data

US 2006/0219267 A1 Oct. 5, 2006

Related U.S. Application Data

(60) Division of application No. 10/802,460, filed on Mar. 16, 2004, now Pat. No. 7,140,374, which is a continuation-in-part of application No. 10/390,117, filed on Mar. 14, 2003, now Pat. No. 6,939,796, and a continuation-in-part of application No. 10/390,520, filed on Mar. 14, 2003, now Pat. No. 6,821,899, and a continuation-in-part of application No. 10/744,355, filed on Dec. 22, 2003, now Pat. No. 7,009,281.

(51) Int. Cl.
*C25F 3/12* (2006.01)
*B08B 9/027* (2006.01)
(52) U.S. Cl. ............. 134/1.1; 134/1.2; 134/1.3; 134/17; 134/35; 118/715

(58) Field of Classification Search .................. 118/715; 134/22.1, 1.1, 1.2, 1.3, 17, 35
See application file for complete search history.

(56) References Cited

U.S. PATENT DOCUMENTS

| 5,154,730 | A | * | 10/1992 | Hodos et al. ................ 29/25.01 |
| 5,685,942 | A | * | 11/1997 | Ishii ........................ 156/345.48 |
| 6,223,684 | B1 | * | 5/2001 | Fujioka et al. ............ 118/723 R |
| 6,699,399 | B1 | * | 3/2004 | Qian et al. ...................... 216/67 |
| 2002/0052114 | A1 | * | 5/2002 | Marks ........................... 438/689 |
| 2003/0066605 | A1 | * | 4/2003 | Ko et al. .................. 156/345.29 |
| 2005/0279284 | A1 | * | 12/2005 | May et al. ...................... 118/724 |
| 2006/0223233 | A1 | * | 10/2006 | Zhao et al. ..................... 438/109 |
| 2006/0246690 | A1 | * | 11/2006 | Dordi et al. ................... 438/478 |
| 2007/0194252 | A1 | * | 8/2007 | Horsky et al. ............ 250/492.21 |

FOREIGN PATENT DOCUMENTS

JP 05-243190 * 9/1993

* cited by examiner

*Primary Examiner* — Parviz Hassanzadeh
*Assistant Examiner* — Satish Chandra
(74) *Attorney, Agent, or Firm* — Martine Penilla Group, LLP

(57) ABSTRACT

A method for cleaning a processing chamber that includes heating an inner surface of the processing chamber to a first temperature. The first temperature can be sufficient to cause a first species to become volatile. The first species can be one of several species deposited on the inner surface. A cleaning chemistry is injected into the processing chamber. The cleaning chemistry can be reactive with a second one of the species to convert the second species to the first species. The volatilized first species can also be output from the processing chamber. A system for cleaning the process chamber is also described.

16 Claims, 3 Drawing Sheets

SYSTEM, METHOD AND APPARATUS FOR SELF-CLEANING DRY ETCH

CROSS REFERENCE TO RELATED APPLICATIONS

This application is a divisional application of and claims priority from U.S. patent application Ser. No. 10/802,460, filed Mar. 16, 2004 now U.S. Pat. No. 7,140,374 and entitled "System, Method and Apparatus for Self-Cleaning Dry Etch" which is incorporated herein by reference in its entirety for all purposes. U.S. patent application Ser. No. 10/802,460 is a continuation-in-part of and claims priority from U.S. patent application Ser. No. 10/390,117 filed on Mar. 14, 2003 now U.S. Pat. No. 6,939,796 and entitled "System, Method and Apparatus For Improved Global Dual-Damascene Planarization," which is incorporated herein by reference in its entirety. U.S. patent application Ser. No. 10/802,460 is also a continuation-in-part of and claims priority from U.S. patent application Ser. No. 10/390,520 filed on Mar. 14, 2003 now U.S. Pat. No. 6,821,899 and entitled "System, Method and Apparatus For Improved Local Dual-Damascene Planarization," which is incorporated herein by reference in its entirety. U.S. patent application Ser. No. 10/802,460 is also a continuation-in-part of Ser. No. 10/744,355, filed Dec. 22, 2003 and claims priority from U.S. Pat. No. 7,009,281 issued on Mar. 7, 2006 and entitled "Small Volume Process Chamber with Hot Inner Surfaces," which is incorporated herein by reference in its entirety.

BACKGROUND OF THE INVENTION

The present invention relates generally to etching semiconductor substrates, and more particularly, to systems and methods for dry etching semiconductor substrates and for cleaning the etch process chamber.

In general, the manufacturing of the integrated circuit devices (in the form of semiconductor substrates and wafers) includes the use of plasma etching chambers. The plasma etch chambers are capable of etching selected layers on the substrate as defined by a mask or pattern. The plasma etch chambers are configured to receive processing gases (i.e., etch chemistries) while a radio frequency (RF) power is applied to one or more electrodes of the plasma etch chamber. The pressure inside the plasma etch chamber is also controlled for the particular process. Upon applying the desired RF power to the electrode(s), the process gases in the chamber are activated such that a plasma is created. The plasma is thus configured to perform the desired etching of the selected layers of the semiconductor wafer.

Low volatility byproducts are produced in some prior art plasma etch processes. By way of example, in a copper etch process using chlorine containing gases (e.g., Cl2 and HCl), the byproduct is CuClx. CuClx is non-volatile at room temperature. The low-volatility byproducts typically condense on the chamber walls. During each plasma etch cycle, the byproducts build-up on the chamber walls. Eventually the byproducts build-up to a certain thickness. The byproduct build-up then begins to "flake" off of the chamber walls and is therefore becomes a significant particle source. The particles can contaminate the substrates being etched in the chamber.

The conductive byproduct deposits can also interfere with the operation of the plasma. By way of example the conductive deposits can short out and even extinguish the plasma. The conductive deposits can also change the plasma density that can significantly affect process in an inductively coupled plasma chamber. A non-conductive deposit can alter the electrode area conditions in a capacitively coupled plasma chamber. These and other effects can impact the efficacy of etching multilayered thin film stacks.

Recognizing that the internal surfaces of the plasma etch chamber are exposed to the plasma, the chambers are often designed to permit the use of simple lining parts, such as, disks, rings, and cylinders. Because these lining parts are configured to confine the plasma over the substrate being processed, these parts are continuously exposed and attacked by the processing plasma energies. Due to this exposure, these parts ultimately erode or accumulate byproduct buildup, requiring replacement or thorough cleaning. However, the cleaning and/or replacement costs of these lining parts can become very expensive both in actual cost and in lost production time required for the cleaning and replacement.

Additionally, the process chamber must also be cleaned frequently to reduce the particle contamination or variation in plasma conditions due to variable RF coupling across byproduct covered inner surfaces. The frequent cleaning requirement reduces the time the process chamber can available for etching processes and thereby reduces the substrate throughput of the process chamber.

In view of the foregoing, there is a need for a system and method for reducing the process chamber cleaning requirement and thereby increase the time the process chamber can available for etching processes.

SUMMARY OF THE INVENTION

Broadly speaking, the present invention fills these needs by providing a system and method for reducing the process chamber cleaning requirement. It should be appreciated that the present invention can be implemented in numerous ways, including as a process, an apparatus, a system, computer readable media, or a device. Several inventive embodiments of the present invention are described below.

One embodiment provides method for cleaning a processing chamber. The method includes heating an inner surface of the processing chamber to a first temperature. The first temperature can be sufficient to cause a first species to become volatile. The first species can be one of several species deposited on the inner surface. A cleaning chemistry is injected into the processing chamber. The cleaning chemistry can be reactive with a second one of the species to convert the second species to the first species. The volatilized first species can also be output from the processing chamber.

The processing chamber can also include a substrate to be processed. The surface of the substrate can also be etched at substantially the same time as the processing chamber is being cleaned. Etching the surface of the substrate can include etching a multi layered thin film stack on the substrate in a single chamber.

The method can also include heating the substrate. The substrate can be supported by a chuck. The chuck can be heated. The substrate can be heated to substantially the first temperature. A bias voltage can also be allied to the substrate.

Outputting the volatilized first species from the processing chamber can include condensing at least a portion of the volatilized first species on a second surface that has a temperature less than the first temperature.

Injecting the cleaning chemistry into the processing chamber can include reducing the second one of the species. The first species is at least one of a metal and halogen compound and a metal and oxygen compound, and the second species is at least one of a non-volatile metal and a metal containing compound. The metal can include at least one of a group consisting of copper, tantalum, tungsten, platinum, iridium, ruthenium, hafnium, zirconium and aluminum.

The inner surfaces are heated to a range of about 200 to about 400 degrees C. The inner surfaces can be heated by a plasma formed within the processing chamber. The cleaning chemistry can include at least one of a group consisting of a halogen gas, an inert gas and a hydrogen-containing gas.

Another embodiment provides a method for etching a substrate. The method includes etching a first surface of the first substrate in a processing chamber while simultaneously outputting a volatile species and depositing a non-volatile species on the inner surfaces of the processing chamber. The first surface of the first substrate is passivated while simultaneously reducing and converting at least a portion of the deposited non-volatile species on the inner surfaces to a volatile species. The first substrate is removed from the processing chamber.

The method can also include loading a second substrate into the processing chamber. A second surface of the second substrate can be etched while simultaneously outputting the volatile species and depositing the non-volatile species on the inner surfaces of the processing chamber. The second surface of the second substrate can be passivated while simultaneously reducing and converting at least a portion of the deposited non-volatile species on the inner surfaces to the volatile species.

Another embodiment provides a processing chamber that includes multiple inner surfaces having multiple deposits thereon, a gas inlet, an outlet and a heat source. The heat source being capable heating at least one of the inner surfaces to a first temperature in the range of about 200 to about 400 degrees C.

The heat source can be a plasma. The processing chamber can also include a heated chuck for supporting a substrate and a bias source coupled to the chuck.

The processing chamber can also include a condensing surface having a temperature less than the first temperature. The condensing surface can be proximate to the outlet.

Still another embodiment provides a processing chamber including a plurality of inner surfaces, a plurality of deposits thereon. The processing chamber also includes a gas inlet, an outlet, a condensing surface proximate to the outlet, a heat source and a cleaning chemistry source. The heat source being capable heating at least one of the plurality of inner surfaces to a first temperature. The first temperature being sufficient to cause a first species to become volatile. The first species being one of a plurality of byproducts of a first process. The plurality of byproducts also including a plurality of species deposited on the inner surface. The cleaning chemistry source is coupled to the processing chamber. The cleaning chemistry being reactive with a second one of the plurality of species to convert the second species to the first species. The condensing surface having a second temperature less than the first temperature.

The heat source can be a plasma. The processing chamber can also include a chuck for supporting a substrate and a bias source coupled to the chuck. The chuck can include a heat source. The heat source in the chuck can be capable of heating the substrate. The heat source in the chuck can be capable of heating the substrate to substantially the first temperature.

A surface of the substrate can be etched at substantially the same time as the cleaning chemistry is present in the processing chamber. The cleaning chemistry can be operable to reduce the second one of the plurality of specie. The first species is at least one of a metal and halogen compound and a metal and oxygen compound, and wherein the second species is at least one of a non-volatile metal and a metal containing compound. The metal can include at least one of a group consisting of copper, tantalum, tungsten, platinum, iridium, ruthenium, hafnium, zirconium and aluminum.

The cleaning chemistry can include at least one of a group consisting of a halogen gas, an inert gas and a hydrogen-containing gas. The first temperature is in the range of about 200 to about 400 degrees C. The condensing surface can be actively or passively cooled to the second temperature. The second temperature can be about 50 degrees C. less than the first temperature.

Yet another embodiment provides a processing chamber including a plurality of inner surfaces, a plurality of deposits thereon, a substrate to be processed, a gas inlet, an outlet, a condensing surface proximate to the outlet, a heat source and a cleaning chemistry source coupled to the processing chamber. The heat source being capable heating at least one of the plurality of inner surfaces to a first temperature. The first temperature being sufficient to cause a first species to become volatile. The first species being one of a plurality of byproducts of a first process. The plurality of byproducts also including a plurality of species deposited on the inner surface. The heat source is a plasma. The cleaning chemistry being reactive with a second one of the plurality of species to convert the second species to the first species and the condensing surface having a second temperature less than the first temperature. A surface of the substrate is etched at substantially the same time as the cleaning chemistry is present in the processing chamber. The cleaning chemistry is operable to reduce the second one of the plurality of specie.

Yet another embodiment provides a processing chamber including a plurality of inner surfaces, a plurality of deposits thereon, a gas inlet, an outlet, a condensing surface proximate to the outlet, a heat source and a cleaning chemistry source coupled to the processing chamber. The heat source being capable heating at least one of the plurality of inner surfaces to a first temperature. The first temperature is in the range of about 200 to about 400 degrees C. The first temperature being sufficient to cause a first species to become volatile. The first species being one of a plurality of byproducts of a first process. The plurality of byproducts also including a plurality of species deposited on the inner surface. The cleaning chemistry being reactive with a second one of the plurality of species to convert the second species to the first species. The condensing surface having a second temperature less than the first temperature, wherein the condensing surface is actively cooled to the second temperature.

The present invention provides the benefit of a reduced or substantially eliminated process chamber cleaning requirement and thereby increases the substrate throughput. The present invention also provides a more simplified cleaning process and cleaning chemistry than was previously utilized. The simplified cleaning chemistry can also decrease the financial cost of cleaning the process chamber.

The present invention also can substantially reduce process variability induced by plasma density change caused by deposits on inner surfaces of the plasma chamber. As a result the variability from substrate to substrate can be significantly reduced as well as enabling integrated processing of multi layered thin film stacks that have different sensitivities to plasma conditions. By way of example, a copper interconnect stack has copper barrier materials such as Ta/TaN and intermetal dielectrics. This benefit can be extended to other applications such as etching of a MRAM stack Other aspects and advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, and like reference numerals designate like structural elements.

DETAILED DESCRIPTION OF THE EXEMPLARY EMBODIMENTS

Figure 1:
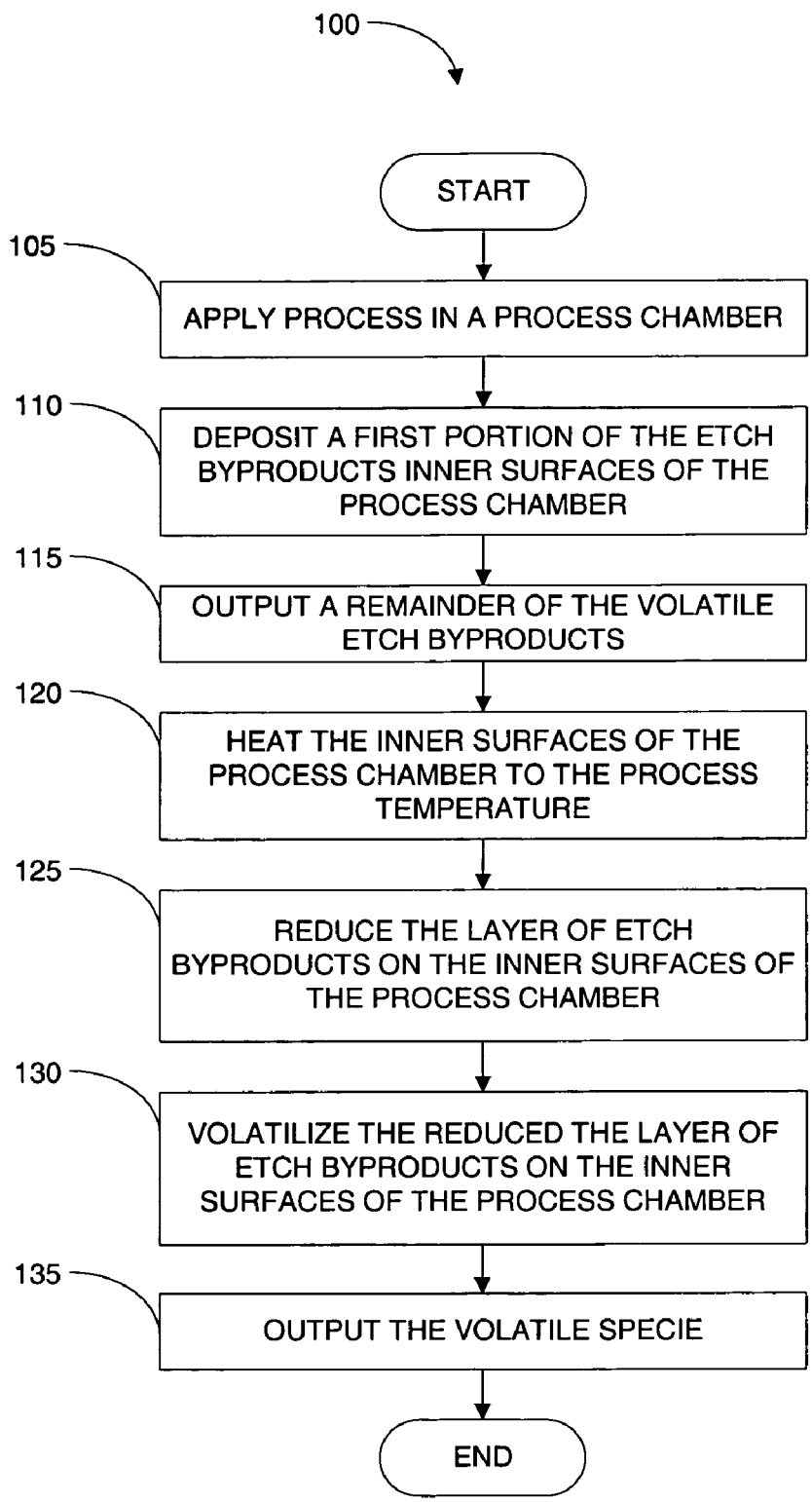
FIG. 1 is a flowchart of the method operations for processing a substrate in accordance with an embodiment of the present invention.

Several exemplary embodiments for an improved chamber cleaning process will now be described. It will be apparent to those skilled in the art that the present invention may be practiced without some or all of the specific details set forth herein.

Halogen gas (e.g., Chlorine, Fluorine, Bromine, etc.) based processes can be used to dry etch copper for interconnect applications. Halogen dry etch processes can be performed for copper etch back for stress free polish or planarization of damascene copper or patterning of copper interconnects such as described in U.S. patent application Ser. No. 10/390,117 filed on Mar. 14, 2003, entitled "System, Method and Apparatus For Improved Global Dual-Damascene Planarization," which is incorporated herein by reference in its entirety. And is also described in U.S. patent application Ser. No. 10/390,520 filed on Mar. 14, 2003, entitled "System, Method and Apparatus For Improved Local Dual-Damascene Planarization," which is also incorporated herein by reference in its entirety.

However, as is typical in copper dry etch processes, a halogen copper dry etch process can form copper containing etch byproduct deposits on the inner surfaces of the process chamber. The deposits can eventually fall off of the inner surfaces and cause particle contamination of the surfaces of the substrate being etched. Additionally, the deposits can alter plasma conditions that can therefore affect the process. The process chamber must therefore be frequently cleaned to reduce the particle contamination. The frequent cleaning requirement reduces the time the process chamber can available for etching processes and thereby reduces the substrate throughput of the process chamber.

Further, the copper containing etch byproduct deposits can also be very difficult to clean off of the inner surfaces of the process chamber. Various cleaning chemistries are used to clean the deposits that are formed on the inner surfaces of the process chamber. Many of these processing chemistries are very complex and expensive. By way of example, U.S. Pat. No. 6,352,081, entitled "Method of Cleaning a Semiconductor Device Processing Chamber After a Copper Etch Process" describes a process chamber cleaning method that uses 1,1,1,5,5,5-hexafluoro-2,4-pentanedione.

The present invention combines a copper etch process and a cleaning process that can be used to remove copper-containing species that have been deposited on the inner surfaces of the process chamber at substantially the same time that the copper etch process is being applied to the substrate. As a result, the need for separate process chamber cleaning processes are substantially eliminated, thus increasing the time the process chamber is available for etching processes and thereby increasing the substrate throughput of the process chamber.

Copper-halogen species are volatile above a certain temperature of volatility. Each different copper-halogen species has a respective temperature of volatility. Heating the inner surfaces of the process chamber at or above the applicable temperature of volatility can substantially establish an equilibrium between the deposition of the copper-halogen species on the inner surfaces of the process chamber and the etching of the copper from the substrate.

FIG. 1 is a flowchart 100 of the method operations for processing a substrate in accordance with an embodiment of the present invention. In an operation 105, a process is applied in a process chamber. The process can include an etch process (e.g., etching copper or other materials from a substrate). In the etch process, etch byproducts (e.g., copper-halogen species) are released from the substrate. The process can also include a cleaning operation (e.g., reducing and/or removing deposits from the inner surfaces of the chamber with or without a substrate being processed in the process chamber). In a cleaning process, the etch byproducts that were previously deposited on the inner surfaces of the process chamber are released from the inner surfaces.

The process can use a halogen-based etch chemistry mixed with a hydrogen-containing chemistry that can also be input to the process chamber. By way of example, a chlorine containing etch chemistry (e.g., $Cl_2$, HCl, $BCl_3$, etc.) can be input to the process chamber. The chlorine containing etch chemistry can also be input with an inert carrier gas such as a noble gas or nitrogen. Hydrogen gas or hydrogen-containing gases (e.g., $H_2$, $NH_3$, $CH_4$, HCl, HBr, etc.) can also be input with the chlorine containing etch chemistry. By way of example, a total flow rate of the gas mixtures of about 5 to about 500 sccm can be input to the process chamber. In one embodiment, the ratio of chlorine molecules to hydrogen molecules is maintained at about a 1:1 ratio, however, ratios less than (e.g., about 1:2 ratio) or greater than (e.g., about 2:1 ratio) can also be used.

In an operation 110, a first portion of the etch byproducts (e.g., as $CuCl_2$, CuCl, or elemental copper) can be deposited on the inner surfaces of the process chamber. In an operation 115, a remainder of the volatile etch byproducts can be output from the process chamber such as by a purge or a vacuum.

By way of example, a chlorine containing etch chemistry can etch a copper layer on the substrate, forming etch byproducts including $Cu_3Cl_3$, $CuCl_2$, CuCl and elemental copper. At the process temperature of about 200 degrees C. or greater, $Cu_3Cl_3$ is volatile while $CuCl_2$, CuCl and elemental copper may not be volatile. A non-volatile first portion of the etch byproducts (e.g., $CuCl_2$, CuCl and elemental copper) can deposit on the inner surfaces of the process chamber even at temperatures well above 200 degrees C. (e.g., greater than about 400 degrees C.). A second, volatile portion of the etch byproducts (e.g., the $Cu_3Cl_3$) is output from the process chamber.

However, as a second portion of the $Cu_3Cl_3$ cools (e.g., as the $Cu_3Cl_3$ contacts a cooler surface such as the inner surface of the process chamber), the second portion is converted to $CuCl_2$, which is not volatile at the process temperature. Therefore, while $Cu_3Cl_3$ is formed during the etch process, a layer of $CuCl_2$ can be formed on the inner surfaces of the process chamber.

In an operation 120, the inner surfaces of the process chamber are heated to the process temperature. In an operation 125, the hydrogen input with the halogen based etch chemistry can react with the layer of etch byproducts (e.g., $CuCl_2$) that is formed on the inner surfaces of the process chamber. The non-volatile copper chloride is reduced to elemental copper and the chlorine combines with the hydrogen to form HCl that is volatile at the process temperature.

In an operation 130, the elemental copper can react with the halogen based plasma to become one or more a volatile species that can be removed from the process chamber through the outlet in an operation 135. The method operations can then end. It should be understood that the operations 105-135 are not required to be performed in the order illustrated. Some of the operations may occur substantially simultaneously or in an order other than as described.

Figure 2:
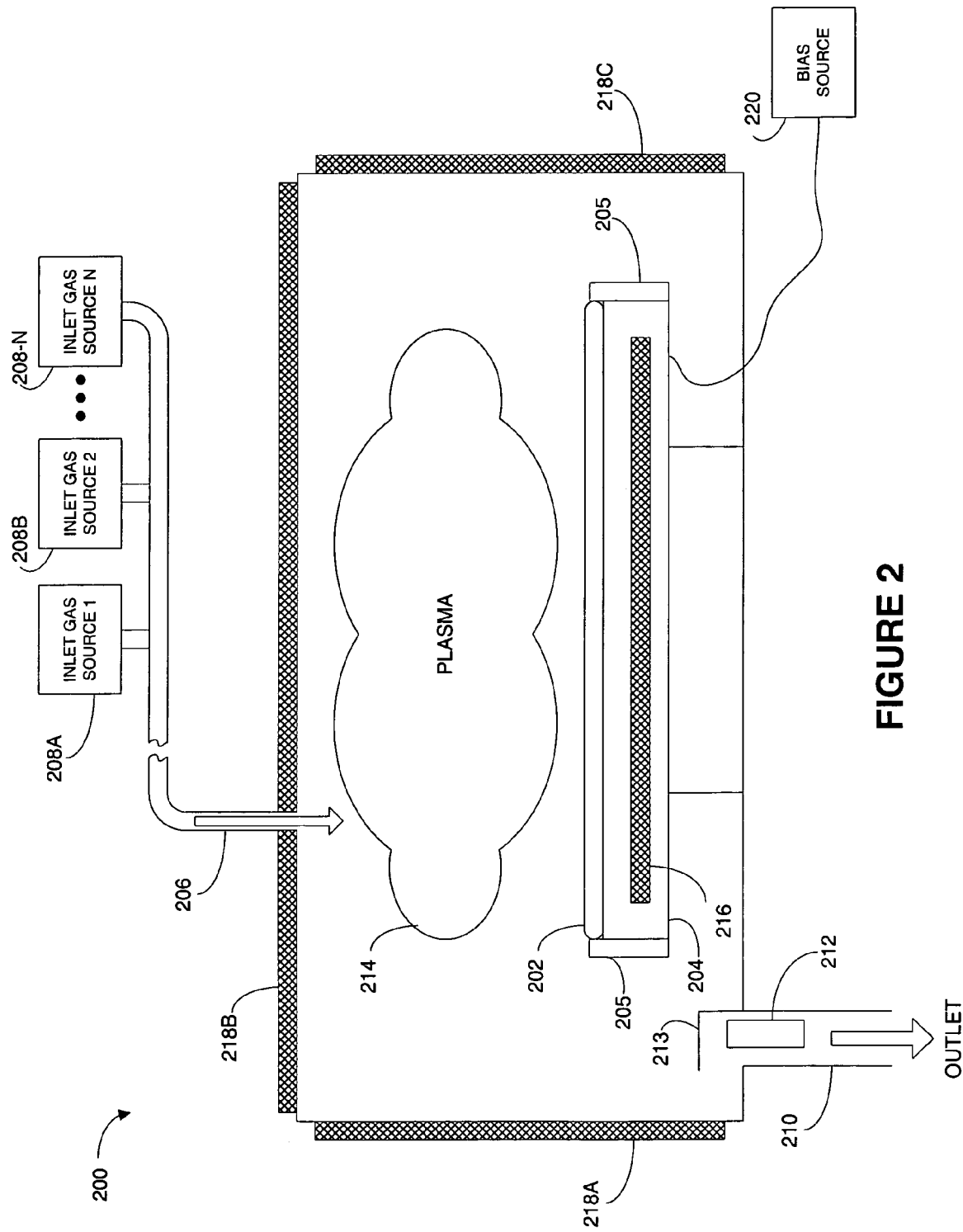
FIG. 2 is a simplified view of a process chamber, in accordance with one embodiment of the present invention.

FIG. 2 is a simplified view of a process chamber 200, in accordance with one embodiment of the present invention. The process chamber 200 can include a substrate 202 for processing. A substrate support (e.g., a chuck) 204 can support the substrate for processing. A retaining ring 205 can also be included to more securely support and position the substrate on the chuck 204. A gas inlet 206 is provided so that the process gases and other chemistries can be input to the process chamber 200. Multiple inlet gas sources 208A-208-N can be coupled to the inlet 206.

The multiple inlet gas sources 208A-208-N allow each of the gases to be mixed and combined at different flow rates, concentrations and pressures as may be required by the process to be performed in the process chamber. By way of example an inlet gas source 1 208A can supply an inert carrier gas (e.g., one or more noble gases or nitrogen). Inlet gas source 2 208B can supply a halogen based processing chemistry and inlet gas source N 208-N can supply hydrogen. The respective flow rates and pressures of the different inlet gas sources 208A, 208B and 208-N can be controlled to provide a desired concentrations and mixtures of the halogen based processing chemistry and hydrogen that is carried into the process chamber 200 by the carrier gas.

The process chamber 200 also includes an outlet 210. The outlet can be coupled to a vacuum pump (not shown) so as to draw the process byproducts from the process chamber. While the process chamber 200 is shown having a single inlet 206 and a single outlet 210, it should be understood, that multiple inlets and outlets could also be included.

A relatively cooler surface 212 can be provided proximate to or even inside the outlet 212. As described above, the cooler surface 212 has a temperature less than the process temperature so as to collect many of the byproducts that may deposit on such a cooler surface. The cooler surface 212 can be maintained at a temperature less than the process temperature (e.g., more than about 50 degrees C. cooler than the process temperature) by way of active or passive cooling. The outlet 210 and/or the cooler surface 212 can also include a flow diverting device(s) 213 to at least partially, physically isolate the outlet 210 from the substrate 202.

The plasma 214 can be generated inductively or capacitively. The process chamber 200, substrate 202 and chuck 204 can be heated to the processing temperature by the plasma 214. Alternatively, the process chamber 200 and chuck 204 can be heated by respective heat sources 218A, 218B, 218C and 216. The plasma 214 and the respective heat sources 218A, 218B, 218C and 216 can also be used in combination to heat the process chamber 200 and chuck 204. The heated chuck can also heat the substrate 202 to the process temperature.

A bias voltage source 220 can also be coupled to the chuck 204. A bias voltage applied to the chuck 204 and thereby to the substrate 202, can enhance the processing of the substrate.

Figure 3A:
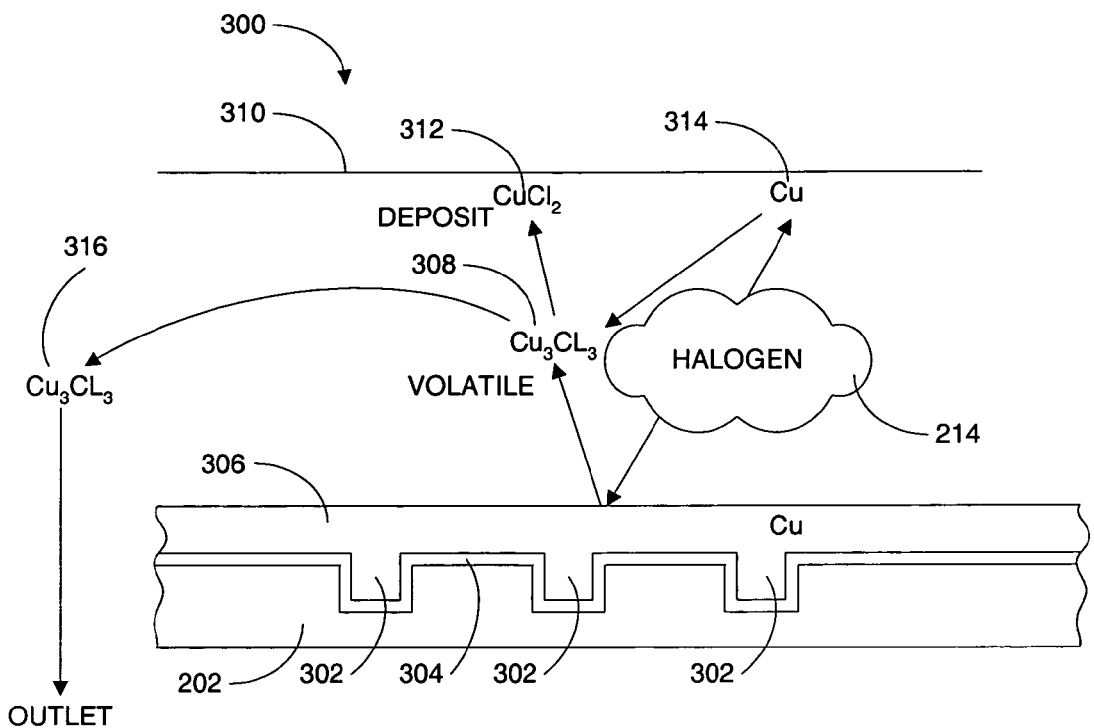
FIGS. 3A and 3B show a more detailed view of the method operations occurring within the process chamber, in accordance with one embodiment of the present invention.
Figure 3B:
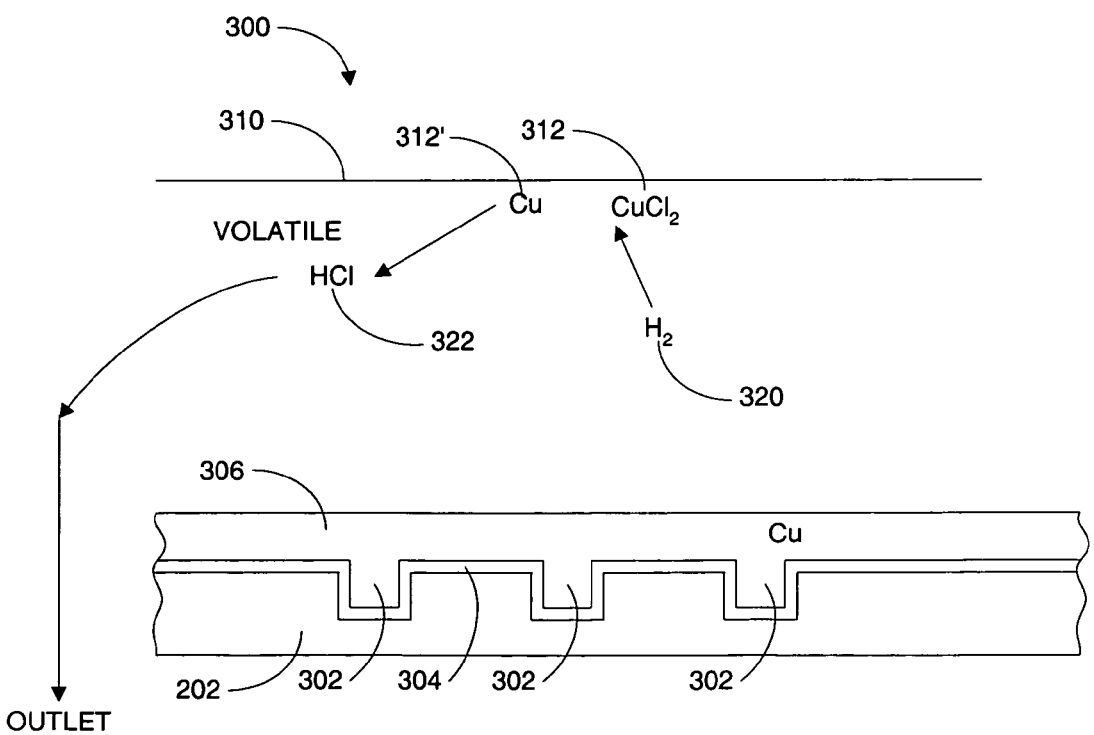

FIGS. 3A and 3B show a more detailed view of the method operations 100 occurring within the process chamber 200, in accordance with one embodiment of the present invention. FIGS. 3A and 3B show the substrate 202 with multiple features 302. A diffusion barrier layer (e.g., tantalum) 304 can also be included. A copper layer 306 has filled the features 302 and an overburden portion has been formed over the features 302.

Referring now to FIG. 3A, a halogen plasma 214 is formed within the process chamber. The inner surfaces 310 and the top layer 306 of the substrate 202 are exposed to the halogen plasma 214. The halogen plasma 214 reacts with the elemental copper and/or copper oxide of the copper layer 306 and the copper and/or copper oxide 314 may be formed on the inner surface 310. The halogen plasma 214 reacts with the copper 306, 314 to form volatile copper-halogen compounds 308 (e.g., $Cu_3Cl_3$). A first portion of the volatile copper-halogen compounds 316 can be output from the process chamber. A layer of non-volatile copper-halogen compounds 312 (e.g., $CuCl_2$) can be formed on the inner surfaces 310. The non-volatile copper-halogen compounds 312 can be formed as the volatile copper-halogen compounds 308 condense on the inner surfaces. The non-volatile copper-halogen compounds 312 can also be formed as a product of the reaction between the halogen plasma 214 and the copper 306, 314.

Referring now to FIG. 3B, hydrogen-containing gas 320 is added to the process chamber 200. It should be understood that the hydrogen-containing gas 320 can be provided at the same time as the halogen plasma 214 is formed in the process chamber 200. The hydrogen 320 reduces the non-volatile copper-halogen compounds 312 by removing the halogen component. By way of example, if Chlorine is the halogen component, then the hydrogen and chlorine form HCl. HCl is volatile at the process temperature and can be output from the outlet 210 of the process chamber 200. Reducing the non-volatile copper-halogen compounds 312 leaves elemental copper or copper oxide 312' on the inner surface 310. The halogen plasma 214 can then react to volatilize the elemental copper or copper oxide 312' on the inner surface 310. In this manner, deposits 312, 312' and 314 that may be formed on the inner surfaces of the process chamber 200 are substantially removed simultaneous with the formation of such deposits (e.g., during an etch process).

While the above-described operations are described in terms of removing copper (e.g., in various etching and cleaning processes), it should be understood that similar processes can be applied to remove tantalum, TaN, Pt, Ir, Al, $AlO_x$, $HfO_x$, and $ZrO_x$ (where "x" is a whole number) and similar materials. Further, while hydrogen is described as the reducing species in the above examples, it should be understood that other reducing species might also be used in similar applications. By way of example, deposits can be reduced by other species such as oxygen and halogens since reduction can include changing the chemical compound or oxidation state. In other words when the deposit is being volatilized in hydrogen-containing chemistry, the deposit is being reduced from the non-volatile species to a volatile species. Therefore, $O_2$, $Cl_2$, HX (where X=Cl, Br, F), $SF_6$, $BCl_3$ can also be used as reducing agents.

Any of the operations described herein that form part of the invention are useful machine operations. The invention also relates to a device or an apparatus for performing these operations. The apparatus may be specially constructed for the required purposes, or it may be a general-purpose computer selectively activated or configured by a computer program stored in the computer. In particular, various general-purpose machines may be used with computer programs written in accordance with the teachings herein, or it may be more convenient to construct a more specialized apparatus to perform the required operations.

The invention can also be embodied as computer readable code on a computer readable medium. The computer readable medium is any data storage device that can store data, which can thereafter be read by a computer system. Examples of the computer readable medium include hard drives, network attached storage (NAS), read-only memory, random-access memory, CD-ROMs, CD-Rs, CD-RWs, magnetic tapes, and other optical and non-optical data storage devices. The computer readable medium can also be distributed over a network coupled computer systems so that the computer readable code is stored and executed in a distributed fashion.

It will be further appreciated that the instructions represented by the operations in any of the above figures are not required to be performed in the order illustrated, and that all the processing represented by the operations may not be necessary to practice the invention. Further, the processes described in any of the above figures can also be implemented in software stored in any one of or combinations of the RAM, the ROM, or the hard disk drive.

Although the foregoing invention has been described in some detail for purposes of clarity of understanding, it will be apparent that certain changes and modifications may be practiced within the scope of the appended claims. Accordingly, the present embodiments are to be considered as illustrative and not restrictive, and the invention is not to be limited to the details given herein, but may be modified within the scope and equivalents of the appended claims.

What is claimed is:

1. A processing apparatus comprising:
   a processing chamber including a plurality of inner surfaces, a plurality of deposits thereon;
   a gas inlet;
   an outlet;
   a condensing surface having a first portion of the condensing surface inside the outlet and not inside the processing chamber and a second portion of the condensing surface is included in the processing chamber and not inside the outlet;
   a heat source capable heating at least one of the plurality of inner surfaces to a first temperature, the first temperature being sufficient to cause a first species to become volatile, the first species being one of a plurality of byproducts of a first process, the plurality of byproducts also including a plurality of species deposited on the inner surface; and
   a cleaning chemistry source coupled to the processing chamber, the cleaning chemistry being reactive with a second one of the plurality of species to convert the second species to the first species and the condensing surface having a second temperature less than the first temperature.

2. The processing apparatus of claim 1, wherein the heat source is a plasma.

3. The processing apparatus of claim 1, further comprising:
   a chuck for supporting a substrate; and
   a bias source coupled to the chuck.

4. The processing apparatus of claim 3, wherein the chuck includes a heat source.

5. The processing apparatus of claim 4, wherein the heat source in the chuck is capable of heating the substrate.

6. The processing apparatus of claim 5, wherein the heat source in the chuck is capable of heating the substrate to substantially the first temperature.

7. The processing apparatus of claim 3, wherein a surface of the substrate is etched at substantially the same time as the cleaning chemistry is present in the processing chamber.

8. The processing apparatus of claim 7, wherein the cleaning chemistry is operable to reduce the second one of the plurality of specie.

9. The processing apparatus of claim 1, wherein the first species is at least one of a metal and halogen compound and a metal and oxygen compound, and wherein the second species is at least one of a non-volatile metal and a metal containing compound.

10. The processing apparatus of claim 9, wherein the metal includes at least one of a group consisting of copper, tantalum, tungsten, platinum, iridium, ruthenium, hafnium, zirconium and aluminum.

11. The processing apparatus of claim 1, wherein the cleaning chemistry includes at least one of a group consisting of a halogen gas, an inert gas and a hydrogen-containing gas.

12. The processing apparatus of claim 1, wherein the first temperature is in the range of about 200 to about 400 degrees C.

13. The processing apparatus of claim 1, wherein the condensing surface is cooled to the second temperature.

14. The processing apparatus of claim 1, wherein the second temperature is about 50 degrees C. less than the first temperature.

15. A processing apparatus comprising:
    a processing chamber including a plurality of inner surfaces, a plurality of deposits thereon;
    a substrate to be processed;
    a gas inlet;
    an outlet;
    a condensing surface having a first portion of the condensing surface inside the outlet and not inside the processing chamber and a second portion of the condensing surface is included in the processing chamber and not inside the outlet;
    a heat source capable heating at least one of the plurality of inner surfaces to a first temperature, the first temperature being sufficient to cause a first species to become volatile, the first species being one of a plurality of byproducts of a first process, the plurality of byproducts also including a plurality of species deposited on the inner surface, wherein the heat source is a plasma; and
    a cleaning chemistry source coupled to the processing chamber, the cleaning chemistry being reactive with a second one of the plurality of species to convert the second species to the first species and the condensing surface having a second temperature less than the first temperature, wherein a surface of the substrate is etched at substantially the same time as the cleaning chemistry is present in the processing chamber, and wherein the cleaning chemistry is operable to reduce the second one of the plurality of specie.

16. A processing apparatus comprising:
    a processing chamber including a plurality of inner surfaces including a bottom inner surface defined by the substrate support, a plurality of deposits on the plurality of inner surfaces;
    a gas inlet;
    an outlet;
    a condensing surface having a first portion of the condensing surface inside the outlet and not inside the processing chamber and a second portion of the condensing surface is included in the processing chamber and not inside the outlet;
    a heat source capable heating at least one of the plurality of inner surfaces to a first temperature, wherein the first temperature is in the range of about 200 to about 400 degrees C., the first temperature being sufficient to cause a first species to become volatile, the first species being one of a plurality of byproducts of a first process, the plurality of byproducts also including a plurality of species deposited on the inner surface; and a cleaning chemistry source coupled to the processing chamber, the cleaning chemistry being reactive with a second one of the plurality of species to convert the second species to the first species and the condensing surface having a second temperature less than the first temperature, wherein the condensing surface is actively cooled to the second temperature.

\* \* \* \* \*